United States Patent [19]

Sakai

[11] Patent Number: 5,465,043
[45] Date of Patent: Nov. 7, 1995

[54] NON-CONTACT TYPE PROBE AND NON-CONTACT TYPE VOLTAGE MEASURING APPARATUS, WHEREIN THE PROBE'S IRRADIATION SURFACE IS COATED WITH A CONDUCTIVE FILM HAVING A PINHOLE

[75] Inventor: Ikuo Sakai, Shizuoka, Japan

[73] Assignee: Hewlett-Packard Company, Palo Alto, Calif.

[21] Appl. No.: 94,415

[22] Filed: Jul. 19, 1993

[30] Foreign Application Priority Data

Jul. 28, 1992 [JP] Japan ................................. 4-221951

[51] Int. Cl.$^6$ .................................................. G01R 19/00
[52] U.S. Cl. ........................... 324/96; 324/750; 324/753
[58] Field of Search ...................... 324/753, 96, 117 R, 324/752, 750; 437/8; 250/310, 311; 356/400, 401; 359/127, 224, 248; 385/40, 18

[56] References Cited

U.S. PATENT DOCUMENTS

| | | | |
|---|---|---|---|
| 4,145,109 | 3/1979 | Nelson | 359/127 |
| 4,182,544 | 1/1980 | McMahon | 359/127 |
| 4,841,234 | 6/1989 | Aoshima et al. | 324/96 |
| 4,891,580 | 1/1990 | Valdmanis | 324/96 |
| 4,920,310 | 4/1990 | Aoshima et al. | 324/96 |
| 4,982,151 | 1/1991 | Takahashi et al. | 324/96 |

FOREIGN PATENT DOCUMENTS

| | | | |
|---|---|---|---|
| 0293841A1 | 12/1988 | European Pat. Off. | G01R 15/07 |
| 0295413A1 | 12/1988 | European Pat. Off. | G01R 1/067 |
| 0493906A1 | 7/1992 | European Pat. Off. | G01R 31/308 |
| 0541139A3 | 5/1993 | European Pat. Off. | G01R 31/308 |
| 3311809A1 | 10/1984 | Germany | G01D 5/26 |
| 1-110743 | 4/1989 | Japan | H01L 21/66 |
| 5-107274 | 4/1993 | Japan | G01R 19/00 |

OTHER PUBLICATIONS

J. F. Whitaker, et al., "External Electro–Optic Probing of Millimeter–Wave Integrated Circuits", IEEE, MTT–S Digest, 1989, pp. 221–224.

M. Shinagawa, et al., "Electro–Optic Sampling Using an External GaAs Probe Tip", Electronics Letters, Aug. 16, 1990, vol. 26, No. 17, pp. 1341–1343.

S. Aoshima, et al., "Non–Contact Picosecond Electro–Optic Sampling Utilizing Semi–Conductor Laser Pulses", SPIE, vol. 1155, Ultrahigh Speed and High Speed Photography, Photonics and Videography, 1989, pp. 499–510.

Siegfried Gorlich, "Electron beam testing versus laser beam testing", Microelectronic Engineering, Mar. 16, 1992, Nos. 1/4, Amsterdam, NL, pp. 349–366.

(List continued on next page.)

Primary Examiner—Vinh P. Nguyen

[57] ABSTRACT

To enable the measurement of the absolute voltage of the wiring under test with no cross-talk and without depending on the gap interval between the probe tip and-the wiring under test. [Construction of the Invention]

The voltage of the conductive films 22 to 24 are controlled by the feedback circuit 55 so that the output of the differential amplifier 52 is equal to zero, for example. No external electric field is applied to the pinhole h, and the voltages of the conductive film and the wiring under test 12 are equal to each other.

The variation in polarization of the measuring light in the electrooptic material 21 is detected as a difference in potential occurring in the electrooptic material 21, and the voltage of the wiring under test 12 is measured on the basis of the difference in potential. Since the voltage of the conductive film is compared with the voltage of the wiring under test, even when an error occurs in distance between the non-contact type probe 20C and the circuit under test 10, this error does not appear as an error for the voltage measurement, and thus the voltage of the wiring under test 12 can be measured with high precision.

13 Claims, 6 Drawing Sheets

OTHER PUBLICATIONS

Kees de Kort, and Joris J. Vrehen, "Waveform Measurements with Calbrated Amplitude by Electro–Optic Sampling in IC's", Microelectronic Engineering, Mar. 16, 1992, No. 1/4, Amsterdam, NL, pp. 341–348.

F. Taenzler, and E. Kubalek, "Use of polymeric materials for external electro–optic probing", Microelectronic Engineering, Mar. 16, 1992, Nos. 1/4, Amsterdam, NL., pp. 325–332.

F. H. Babai, R. B. Dyott, E. A. D. White, "Crystal growth of organic materials in glass capillaries", Journal of Materials Science, vol. 12, pp. 869–872.

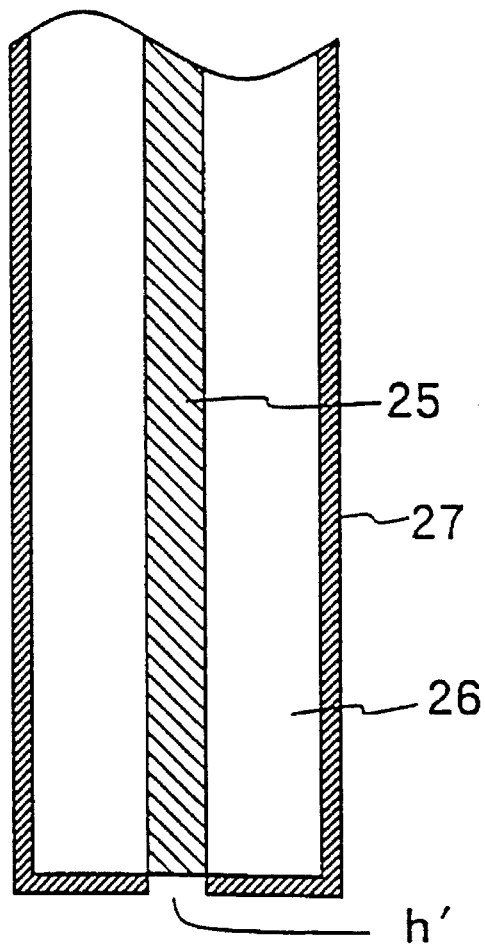 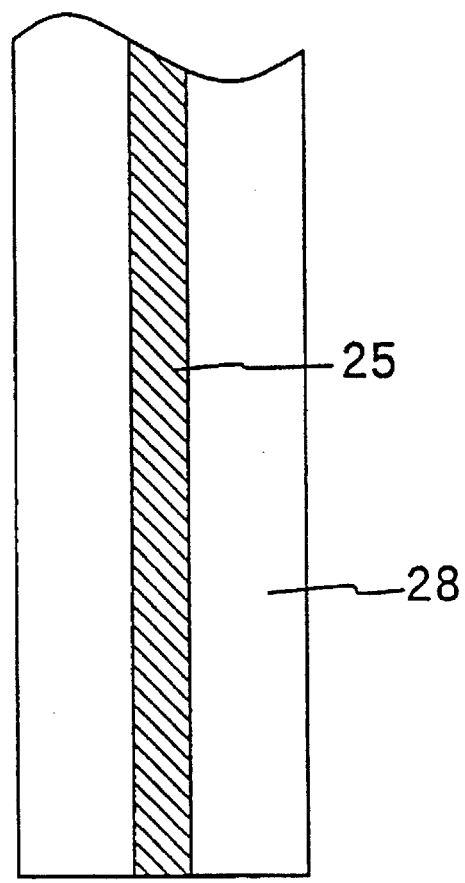
FIG. 5A  FIG. 5B

NON-CONTACT TYPE PROBE AND NON-CONTACT TYPE VOLTAGE MEASURING APPARATUS, WHEREIN THE PROBE'S IRRADIATION SURFACE IS COATED WITH A CONDUCTIVE FILM HAVING A PINHOLE

FIELD OF THE INVENTION

This invention relates to a non-contact type probe and a non-contact type voltage measuring apparatus, and particularly to a non-contact type probe using an electrooptic effect which is capable of detecting variation in polarization of a detection light without being affected by an electric field other than that of an object under test, and a non-contact type voltage measuring apparatus using the non-contact type probe, which is capable of measuring a voltage of any wiring and node of an integrated circuit, an internal circuit of a printed board, etc. in non-contact state.

BACKGROUND OF THE INVENTION

For a testing of an integrated circuit, etc., a method of using an optical pulse having narrow pulse width as a sampling pulse (for example, disclosed in Japanese Laid-open Patent Application No. 1-110743, U.S. Pat. No. 4,891,580, etc.) has been known as a method for testing an internal node of the integrated circuit, etc. in non-contact and non-destructive state at a high speed.

FIG. 6 is a schematic diagram showing the tip construction of a non-contact type probe of a conventional non-contact type voltage measuring apparatus and the arrangement relationship between the non-contact type probe and a circuit under test.

In FIG. 6, wirings 12 and 13 are formed on the surface of a substrate I1 which constitutes the circuit under test. Here, the wiring whose voltage is actually measured (wiring under test) is represented by a reference numeral 12, and wirings other than the wiring under test 12 are represented by a reference numeral 13.

A non-contact type probe 60 is disposed above the wiring under test 12 in such a manner that a gap is formed between the tip of the probe 60 and the surface of the substrate 11. Electrooptic material (material having electrooptic effect) 61 is provided at the tip portion of the non-contact type probe 60 so as to be supported by a base stage 63, and a reflection film 62 is formed at the tip of the electrooptic material 61. In FIG. 6, a laser beam 31 for detection is also shown.

In the non-contact type probe 60 thus constructed, the polarization variation of the detection laser beam 31 in the electrooptic material 61 due to Pockels effect as described later is dependent on the crystal symmetry and crystal orientation of the electrooptic material 61 and the direction of a fringe electric field supplied from the wiring under test 12. The electrooptic material 61 is formed of lithium niobate (LiNbO3), gallium arsenide (GaAs), zinc telluride (ZnTe) or the like, and in the following embodiment, GaAs is used for the electrooptic material 61.

As well known, GaAs is a compound semiconductor of III-V group. The crystal symmetry of GaAs belongs to cubic system, and thus no birefringence occurs in a state where no electric field is applied to the crystal. However, in a state where an electric field is applied to the crystal, the birefringence in proportion to the applied electric field occurs because it has no body center symmetry. Such a phenomenon is known as a primary electrooptic effect, that is, Pockels effect.

This state is represented by the following fundamental equations for an index ellipsoid with an applied electric field and an electrooptic effect.

$$\frac{X_i X_j}{n_{ij}^2} = 1 \quad (1)$$

$$\frac{1}{n_{ij}^2} = \left( \frac{1}{n_{ij}^2} \right)_{Ek=0} + r_{ijk} E_k \quad (2)$$

Here, i, j, k represent integers indicating the crystal direction, $r_{ijk}$ represents an electrooptic coefficient, and $n_{ij}$ represents index of refraction. For GaAs, values other than three electrooptic coefficients $r_{41}$, $r_{52}$ and $r_{63}$ are equal to zero, and the following equation is satisfied.

$$r_{41} = r_{52} = r_{63} \quad (3)$$

In consideration of these relationships, when the direction of a light incident to GaAs is "3" direction, a phase difference (phase retardation) which is caused by the difference between two principal indices of refraction due to the birefringence induced by the electric field.

$$\Gamma = \frac{2\phi}{\lambda} n_0 r_{41} \int E_3 dx_3 \quad 4$$

In the equation (4), the integration is carried out over the thickness d of the electrooptic material (in this case, GaAs) along an optical path of an incident light and a reflected light. Therefore, the integration value corresponds to the difference in potential at the light-passing positions on the surface of the crystal and the back surface of the crystal, and is dependent on only an electric field component in the propagating direction of the light. On the basis of this integration value, an electric field component in parallel to the light in the GaAs crystal (longitudinal effect) is detected.

As described above, by detecting the variation in polarization of the detecting laser beam 31 which is caused due to the Pockels effect, the difference in potential between the surface of the electrooptic material 61 having the reflection film 62 and the opposite surface of the electrooptic material 61 supported on base storage 63 is determined. Since this difference in potential is calibrated to represent the voltage of the wiring under test 12 on the assumption that the distance between the reflection surface 62 and the wiring under test 12 is fixed to a predetermined distance, the voltage of the wiring under test 12 is obtained on the basis of the difference in potential.

However, as shown in FIG. 6, when a circuit wiring 13 which is not an object to be measured is disposed adjacently to the wiring under test 12, the testing may suffer the affection of a so-called cross-talk. That is, lines of electric force extending from the wiring under test 12 are easily distorted due to the voltage of the circuit wiring 13 adjacent to the wiring under test 12, so that there occurs a case where the lines of electric force are not vertical (in parallel to the light) in areas other than the extremely adjacent area to the wiring under test 12. That is, the electric field extending from the circuit wiring 13 is penetrated through the reflection surface 62 and intrude into the path of the laser beam in the electrooptic material 12, so that an electric fields other than the electric field to be originally detected is also detected.

The electric field in GaAs is weakened because GaAs has high dielectric constant (about 13). Therefore, a part of the fringe electric field extending from the wiring under test 12 is passed through the electrooptic material 61, and electric fields other than the fringe electric field are concentrated in the gap between the wiring under test 12 and the electrooptic material 61. As a result, the state of the lines of electric force which pass through the electrooptic material 61 are greatly varied in accordance with the variation of the gap between the wiring under test 12 and the electrooptic material 61. Therefore, if there is a control error in the distance between the wiring under test 12 and the electrooptic material 61, this control error appears as a measurement error for the voltage of the wiring under test.

In addition, the lines of electric force which are thrust into the gap between the wiring under test 12 and the electrooptic material 61 are extremely sensitive to a voltage existing adjacent thereto, and the intensity of the electric field in the electrooptic material 61 is varied by the voltage of the adjacent wiring 13.

Consequently, even when the same voltage is actually measured, the integration value of the equation (4) is not necessarily constant in accordance with the state of a circuit under test.

As described above, in the conventional non-contact type voltage measuring apparatus using the non-contact type probe 60 as shown in FIG. 6, the variation of the polarization (birefringence) due to Pockels effect of the detection laser beam 31 which goes and returns through the electrooptic material 61 is not only greatly varied by the voltage of the wiring 13 adjacent to the wiring under test 12 (that is, suffers the affection of a cross-talk), but also suffers the affection of the gap between the wiring under test 12 and the electrooptic material 61, so that there occurs a problem that the measurement precision is lowered.

If the electrooptic material 61 is contacted with the wiring under test 12, the problem that the variation in polarization is dependent on the gap interval is avoidable. However, in this case, the following great advantages of the non-contact measurement are lost: (1) a wiring under test and a circuit suffer no damage, (2) any position can be rapidly scanned for measurement, (3) there occurs no additive effect such as a parasitic capacitance or the like due to the contact, (4) even a circuit wiring which is coated with a passivation film such as semiconductor devices can be measured, etc., and thus it is apparent that the above solution is not realistic.

SUMMARY OF THE INVENTION

This invention has an object to provide a non-contact type probe using electrooptic effect in which the variation in polarization of a detection light can be detected without being affected by electric fields supplied from elements other than an object to be measured, and a non-contact type voltage measuring apparatus capable of measuring an absolute voltage of a wiring under test with no affection of the voltage of a wiring adjacent to the wiring under test (that is, with no cross-talk), and with no dependence on the gap interval between the tip of the probe and the wiring under test.

The non-contact type probe of this invention is used for the measurement of the intensity of electric field and the voltage measurement of a wiring under test in a noncontact state, and comprises an electrooptic material having an irradiation surface for an external electric field and incident and emitting surfaces for a detection light, wherein the irradiation surface for the external electric field is coated with a conductive film having a pinhole.

The incident and emitting surfaces of the electrooptic material for the detection light may be coated with a transparent conductive film, and the surfaces of the electrooptic material other than the irradiation surface for the external electric field and the incident and emitting surfaces for the detection light may be coated with a conductive film. Of course, a reflection film as shown in FIG. 6 may be formed on the irradiation surface for the external electric field.

The electrooptic material may be formed of lithium niobate ($LiNbO_3$), gallium arsenide (GaAs), zinc telluride (ZnTe) or the like which has been conventionally used.

The surface of the electrooptic material which is located at an opposite position to the irradiation surface thereof for the external electric field (the surface at the side of the circuit under test) is used as the incident and emitting surfaces for the detection light. For example, when $LiNbO_3$ is used for the electrooptic material, the side surface of the electrooptic material may be used as the incident and emitting surfaces for the detection light.

In the non-contact type probe of this invention, the detection light is incident to a portion of the incident surface of the electrooptic material, then reflected from a pinhole opening surface or passed adjacently to the pinhole opening surface, and then emitted from a portion of the emitting surface of the electrooptic material. For example, when GaAs is used for the electrooptic material, the detection light may be adjusted so as to be reflected vertically to the pinhole opening surface. In this case, the coincident and emitting portions of the detection light are incident with each other. Further, when azodye-substituted (PMMA) is used for the electrooptic material, the detection light may be adjusted so as to be slantly incident to the pinhole opening surface. In this case, the incident and emitting portions of the detection light are positionally different from each other.

The pinhole diameter is set to such a value that when objects to be measured, for example, plural wirings of an IC or the like are adjacent to one another, no other wirings than any one wiring under test exist in an area on the SC side which corresponds to the pinhole diameter.

The non-contact type probe of this invention may be constructed by an optical fiber (a probe including an optical fiber is hereinafter referred to as a non-contact type fiber probe"). This non-contact type fiber probe includes an optical fiber comprising a core formed of material having electrooptic effect and a cladding formed of material having lower refractive index than the core, wherein the peripheral surface of the cladding at one end portion of the fiber is coated with a conductive film. In this case, the end surface" of the optical fiber may be coated with no conductive film, or (the whole or a part of) a cladding portion of the end surface may be coated with the conductive film. Further, The cladding of the optical fiber which comprises the core formed of the material having electrooptic effect and the cladding formed of the material having lower refractive index than the core may be designed so as to have conductivity.

A non-linear organic material for a second harmonic generation device (so-called SHG device) for example may be used as the material having electrooptic effect which constitutes the core.

The non-contact type voltage measuring apparatus according to this invention includes a light source for generating a detection light, the non-contact type probe as described above wherein the conductive film coated on the electrooptic material is kept at a fixed potential, the noncontact type probe being disposed in such a manner that the detection light incident into the electrooptic material is reflected from a pinhole opening surface, or passed in parallel to a surface having a pinhole and adjacently to the pinhole portion, means for controlling a distance between the irradiation surface for the external electric field of the non-contact type probe and a circuit under test, a photodetector for photodetecting a light emitted from the electrooptic material, and means for detecting a polarization state of the detection light in the electrooptic material on the basis of the output of the photodetector (hereinafter referred to as "first invention apparatus").

In the first invention apparatus, the non-contact type voltage measuring apparatus of this invention may be equipped with a feedback circuit for controlling the voltage of the conductive film coated on the electrooptic material so that the conductive film coated on the electrooptic crystal is not kept to the fixed potential, but the output of the photodetector is fixed to a constant value (hereinafter referred to as "second invention apparatus?).

Further, the non-contact type voltage measuring apparatus according to this invention includes a light source for generating a detection light, a non-linear probe optically connected to the light source and comprising a non-contact type probe in which a conductive film coated on the peripheral surface, etc. of the cladding or a cladding having conductivity is kept to a fixed potential, means for controlling a distance between one end surface of the optical fiber of the non-contact type probe and a circuit under test, a photodetector for photodetecting a reflected light of the detection light at the one end surface of the optical fiber, which propagates in the optical fiber, and means for detecting a polarization state of the detection light in the core of the optical fiber on the basis of the output of the photodetector (hereinafter referred to as "third invention apparatus").

In the third invention apparatus, the non-contact type voltage measuring apparatus of this invention may be equipped with a feedback circuit for controlling the voltage of the conductive film of the non-contact type fiber probe or the cladding having conductivity so that the conductive film coated on the electrooptic crystal is not kept to the fixed potential, but the output of the photodetector is kept to a constant value (hereinafter referred to as "fourth invention apparatus").

According to the first invention apparatus, the noncontact type probe is so controlled that the tip thereof is disposed above a circuit under test (for example, a circuit such as an SC) and a constant interval (gap) is kept between the circuit under test and the tip of the noncontact type probe. The irradiation surface of the noncontact type probe for the external electric field is coated with a conductive film having a pinhole. The conductive film having the pinhole corresponds to an electrical space filter. Only a fringe electric field from a wiring under test which exists in a direction extending vertically from the pinhole opening surface to the external side of the electrooptic material is passed through the pinhole and enters into the electrooptic material, and electric fields from other wirings other than the wiring under test (which are not objects to be measured) are shielded by the conductive film.

For example, when the electrooptic materials is formed of GaAs or the like which induces the longitudinal electrooptic effect, the detection light propagates vertically to the pinhole opening surface in the electrooptic material and then reflected from the pinhole opening surface, or propagates at a constant angle with respect to the pinhole opening surface and then reflected from the pinhole opening surface, thereafter emitted to the outside of the electrooptic material.

Further, when the electrooptic material is formed of material which induces the transverse electrooptic effect, the detection light propagates in parallel to the surface having the pinhole in the electrooptic material and then passed adjacently to the pinhole opening surface. Thereafter, this light is directly emitted to the outside of the electrooptic material, or it is reflected in the electrooptic material and then emitted to the outside of the electrooptic material.

The light emitted to the outside of the electrooptic material is detected by the photodetector, and the polarization state of the detection light in the electrooptic material is detected on the basis of the output of the photodetector by predetermined means. Thereafter, the difference in potential inside of the electrooptic material (the difference in potential between the pinhole opening surface and the conductive film) is detected, and the voltage of the wiring under test is determined on the basis of the detection result.

As described above, according to the first invention apparatus, the external electric field which is irradiated through the pinhole onto the electrooptic material is only the electric field caused by the wiring under test, and those electric fields which are caused by wirings other than the wiring under test are shielded by the conductive film. Therefore, the voltage measurement can be made with no cross-talk.

According to the second invention apparatus, as described above, the voltage of the conductive film is so controlled by the feedback circuit that the output of the photodetector is fixed to a predetermined constant value. For example, when the voltage of the conductive film is so controlled that the output of the photodetector is equal to zero, it is satisfied that no external electric field is applied to the pinhole and the voltages of the conductive film and the wiring under test are equal to each other.

The variation in polarization of the measuring light in the electrooptic material is detected as the difference in potential which is caused in the electrooptic material, and then the voltage of the wiring under test is measured on the basis of the difference in potential. In the first invention apparatus, when an error occurs in distance between the non-contact type probe and the circuit under test, this error affects the voltage measurement as a voltage measurement error. However, in the second invention apparatus, the voltages of the conductive film and the wiring under test are compared with each other, so that even when an error occurs in distance between the non-contact type probe and the circuit under test, this error does not affect the measurement as the voltage-measurement error.

That is, according to the second invention apparatus, no cross-talk occurs, and at the same time the measurement can be made without depending on the distance between the non-contact type probe and the circuit under test.

The actions of the third and fourth invention apparatuses are basically identical to those of the first and second invention apparatuses. That is, the light reflected from the tip surface of the core is detected by the photodetector, and the polarization state of the measuring light in the core of the optical fiber is detected.

According to the third invention apparatus, like the first invention apparatus, the potential of the wiring under test can be obtained without cross-talk on the basis of the polarization state in the longitudinal direction of the non-contact type fiber probe. Further, according to the fourth invention apparatus, the voltage of the conductive film on the peripheral surface of the cladding or the voltage of the conductive cladding is subjected to feedback so that the polarization state in the non-contact type fiber probe is equal to zero for example to set the voltage of the conductive film or the conductive cladding to be equal to the voltage of the wiring under test, whereby the voltage of the wiring under test can be directly determined like the second invention apparatus.

According to the third and fourth invention apparatuses, since the optical fiber is used as a probe, production of the probe can be easily performed, and the apparatuses can be flexibly matched with the alignment of optical system.

BRIEF DESCRIPTION OF THE DRAWINGS

Fig. 1B shows a case where the incident and emitting surfaces of the electrooptic material for the detection light in the probe of FIG. 1A is coated with a conductive film, and FIG. 1C shows a case where the side surfaces of the electrooptic material in the probe Fig. 1B is coated with a conductive film.

FIGS. 5A and 5B are cross-sectional views of various modes of the noncontact type fiber probe of this invention and the circuit under test, where FIG. 5A shows a case where the side surfaces of the cladding, etc. are coated with the conductive film, and FIG. 5B shows a case where the cladding is formed of conductive material.

DETAILED DESCRIPTION OF THE PREFERRED EMBODIMENTS

An embodiment of a non-contact type probe according to this invention will be described with reference to FIGS. 1(A) to (C).

Figure 1A:
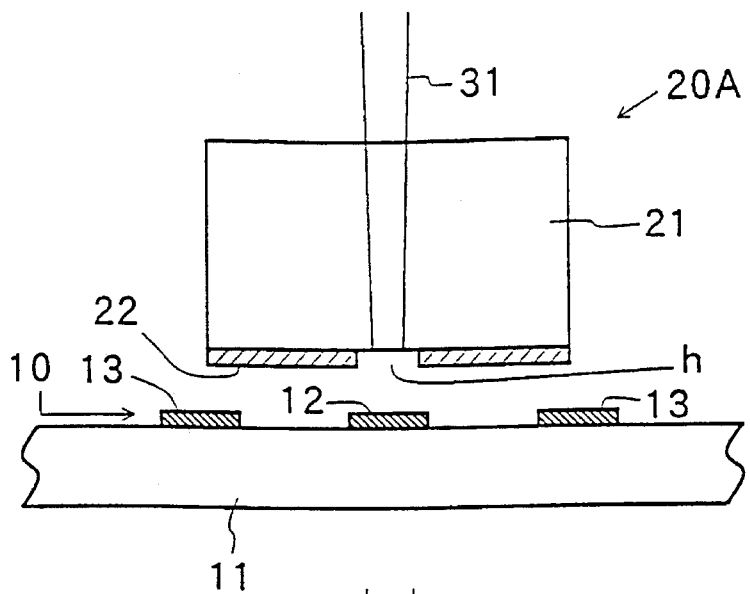
FIGS. 1A–1C are cross-sectional views of various modes of the noncontact type probe and the circuit under test, where 1A shows a case where the irradiation surface of the electrooptic material for the external electric field is coated with the conductive film having the pinhole.
Figure 1B:
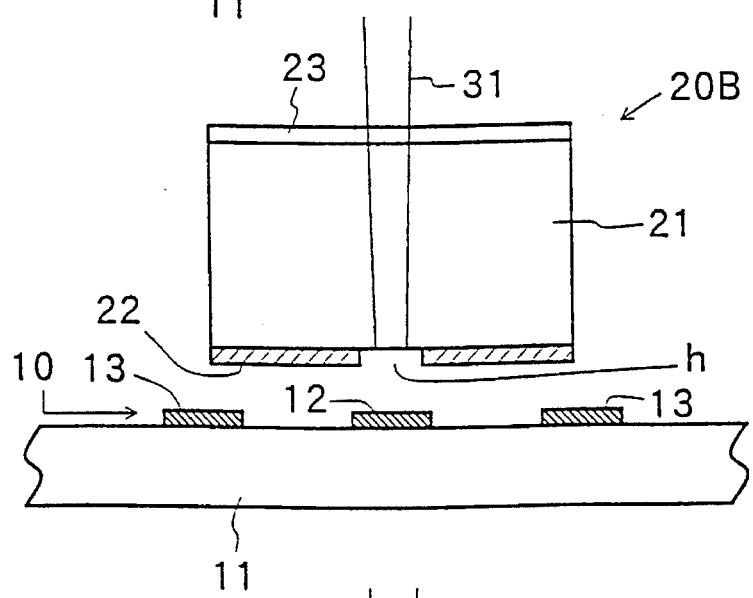
Figure 1C:
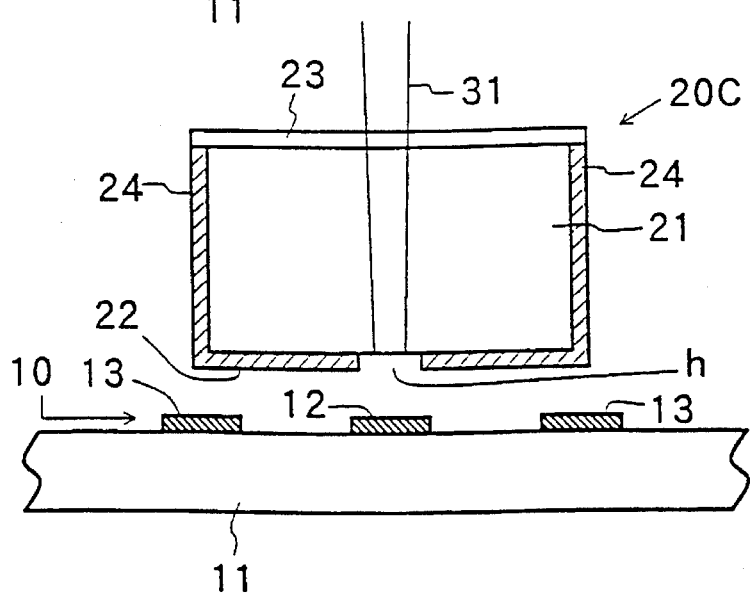

FIGS. 1(A) to (C) are cross-sectional views showing the construction of a tip portion of a non-contact type probe which is suitably applied to the first invention apparatus or the second invention apparatus, and a circuit under test.

The non-contact type probe 20A as shown in FIG. 1(A) is formed of electrooptic material 21 such as GaAs or the like which induces the longitudinal effect, and the irradiation surface of the electrooptic material 21 for the external electric field (in this figure, lower surface) is coated with a conductive film 22 having a pinhole h (here, a base stage is not illustrated). A detection light (usually, a laser beam is used) which is incident onto and emitted from the electrooptic material 21 is represented by a reference numeral 31.

Below the non-contact type probe 20A is disposed a substrate 11 having a circuit under test 10 formed on the surface thereof. A circuit wiring under test serving as an object under test of circuit wirings of the circuit under test 10 is represented by a reference numeral 12, and those circuit wirings which are adjacent to the wiring under test 12 and are not objects to be measured are represented by a reference numeral 13. In Fig. 1(A), the non-contact type probe 20A is so disposed that the pinhole h is located above the wiring under test 12.

The diameter of the pinhole h is determined on the basis of a wiring state of the circuit under test 10 (the width of the wiring, the distance between the wirings, etc.), and it is set to such a size that only the wiring under test 12 exists beneath the pinhole h and the other wirings 13 adjacent to the wiring under test 12 do not exist beneath the pinhole h even when the pinhole h has large size.

The non-contact type probe 20B as shown in FIG. 1(B) is so designed that the upper surface (the incident and emitting surface for the detection laser beam 31) of the electrooptic material 21 of the non-contact type probe 20A is coated with an optically transparent conductive film 23.

The non-contact type probe-20C as shown in FIG. I(C) is so designed that the side surfaces of the electrooptic material 21 of the non-contact type probe 20B as shown in FIG. 1(B) is coated with a conductive film 24.

As not shown, the non-contact type probe of this invention may be so designed that the side surfaces of the non-contact type probe 20A as shown in FIG. 1(A) are coated with the conductive film 24.

Figure 2:
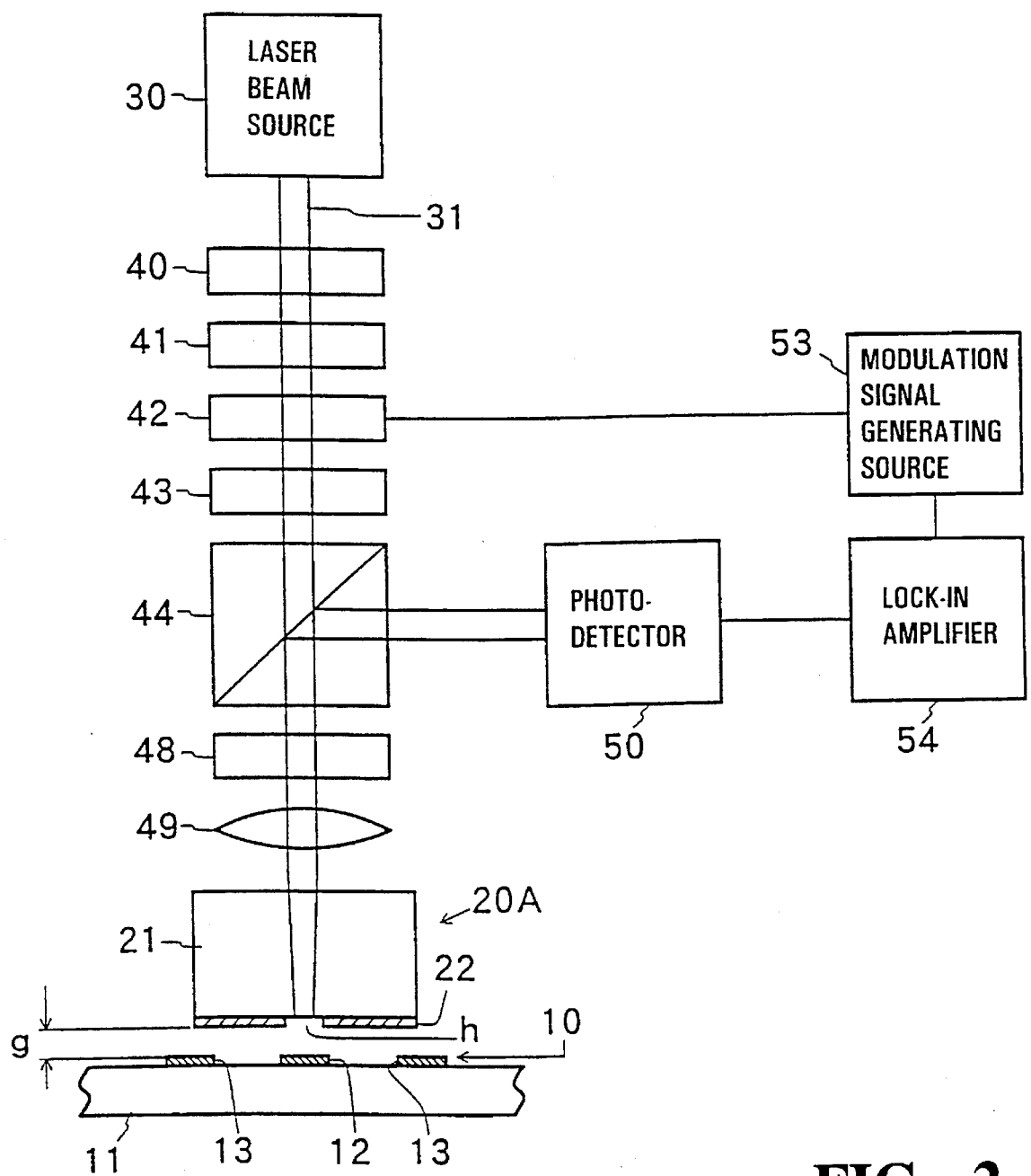
FIG. 2 is a diagram showing an embodiment using a non-contact type probe as shown in FIG. 1A in the first invention apparatus.

FIG. 2 is a diagram showing an embodiment of the first invention apparatus using the non-contact type probe 20A as shown in FIG. 1(A).

In FIG. 2, the detection laser beam 31 which is irradiated from a detection laser beam source 30 is incident to the electrooptic material 21 of the non-contact type probe 20A through an optical system comprising an isolator 40, a polarizer 41, a light modulator 42, a compensator 43, a polarizing beam splitter 44, a quarter wavelength plate 48, and a focusing lens 49. The non-contact type probe 20A is so disposed that the incident detection laser beam 31 is irradiated onto the center of the opening surface of the pinhole h. The detection laser beam 31 is reflected from the opening surface of the pinhole h, and emitted from the electrooptic material 21 along the opposite path to the path for the incident laser beam. The detection laser beam 31 emitted from the electrooptic material 21 is passed through the focusing lens 49 and the quarter wavelength plate 48 to the polarizing beam splitter 44. The emitted light is reflected from the splitter 44, and then irradiated onto the photodetector 50. The photodetector 50 converts the incident polarized beam to an electrical signal, and then output it to a lock-in amplifier 54. On the other hand, the detection laser beam 31 is modulated in a modulator 42 with a modulation signal which is generated in a modulation signal generating circuit 53. Using the lock-in amplifier 54, the output of the photodetector is demodulated with the modulation signal from the modulation signal generating circuit to remove a noise from the output of the photodetector 50, and then the polarization state in the electrooptic material 21 is detected.

The operation of the non-contact type voltage measuring apparatus as shown in FIG. 2 will be hereunder described in detail, mainly describing the state of electric field at the tip of the non-contact probe 20A.

Figure 3:
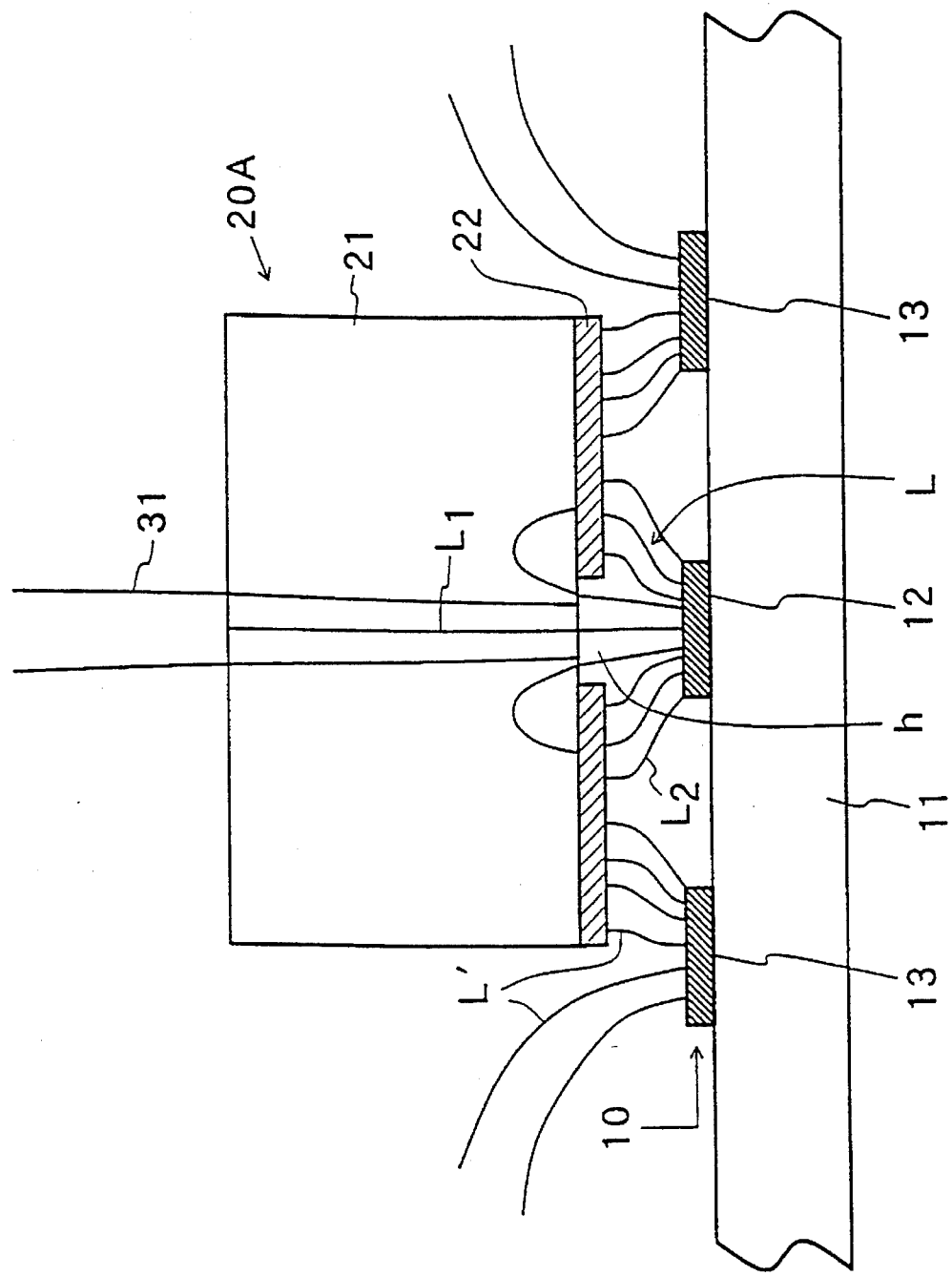
FIG. 3 is a schematic view of the state of the fringe electric field when the non-contact type probe of this invention is used for the first invention apparatus.

As shown in FIG. 3, a part of lines of electric force (represented by L1) representing a fringe electric field which extends from the wiring under test 12 on the substrate 11 is passed through the pinhole which is formed in the conductive film 22 on the surface of the electrooptic material 21 located above the wiring under test 12, and then enters the electrooptic material 21. Another part of the lines of electric force (represented by $L_2$) reaches the conductive film 22 which is kept to a fixed potential.

The voltage of the conductive film 22 is usually set to zero (V) in order to correctly identify positive and negative signs of the voltage of the wiring under test 12, however, it is not necessarily required. No obstruction is imposed on the measurement even if the voltage of the conductive film 22 is set to any constant value other than zero (V). That is, in this case, a constant value is merely added to a measurement value.

On the other hand, a part of lines of electric force (represented by L') extending from the circuit wiring 13 which is adjacent to the wiring under test 12 reaches the conductive film 22 which is fixedly kept on the surface of the electrooptic material 21, however, it does not enter the electrooptic material 21 because of protection of the conductive film 22.

As a result, the lines of electric force which can enter the electrooptic material 21 are limited to those lines of electric force which extend from the wiring under test 12 beneath the electrooptic material 21, and the integration value of the equation (4) does not suffer the affection of the circuit wiring 13 adjacent to the wiring under test 12. Therefore, the non-contact voltage measurement with no cross-talk can be performed.

This advantage is obtained by the shield effect of the conductive film 22, and in order to sufficiently improve this shield effect, the diameter of the pinhole h of the conductive film 22 is set to such a size that no wirings 13 other than the wiring under test 12 exist beneath the pinhole h.

In the manner as described above, the variation in polarization (birefringence) of the detection laser beam 31 due to the electrooptic effect in the electrooptic material 21 is caused by only the electric field extending from the wiring under test 12, and this variation in polarization is detected by the photodetector 50 as described above (see FIG. 2), whereby the voltage measurement having no cross-talk can be performed in a non-contact state.

The above description is made in the case where the non-contact type probe as shown in FIG. 1(A) is used. When the non-contact type probe 20B as shown in FIG. 1(B) is used, the optically-transparent conductive film 23 which is coated on the incident and emitting surfaces of the electrooptic material 21 for the detection laser beam 27 may be kept to a constant voltage to obtain more excellent effect.

In the non-contact type probe 20B as described above, the lines of electric force extending from the circuit wirings 13 other than the wiring under test 12 is shielded by the conductive film 22 coated on the irradiation surface for the external electric field. In addition, even when the lines of electric force extend from the circuit wirings 13 around the electrooptic material 21 to the incident and emitting surfaces of the electrooptic material 21 for the detection laser 27, these lines of electric force are shielded by the optically-transparent conductive film 23 coated on the incident and emitting surfaces, so that the voltage measurement having no cross-talk can be performed.

Further, in the non-contact type probe 20B, since the upper-limit and lower-limit integration values of the equation (4) are determined by setting the voltage of the transparent conductive film of the electrooptic material 22 to a predetermined value, the absolute value of the voltage of the wiring under test 12 can be correctly determined.

When only the problem of the cross-talk is required to be overcome and the electrooptic material 21 is sufficiently thick, the transparent conductive film 23 as described above is not necessarily required because the lines of electric force from the circuit wirings 13 other than the wiring under test 12 hardly further extend around the electrooptic material 21 to the incident and emitting surfaces of the detection laser beam 27.

As the non-contact type probe 20A or 20B is wider or thicker, the affection of the cross-talk is more reduced. In order to completely remove the affection of the cross-talk irrespective of the size of the circuit under test 10, the non-contact type probe 20C in which all the surfaces as shown in FIG. 1(C), except for the pinhole h, are coated with the conductive film may be used.

When the non-contact type probes 20A and 20B as shown in FIGS. 1(A) and 1(B) are used, there is possibility that the lines of electric force extending from the wirings other than the wiring under test 12 slightly invade through the side surfaces of the electrooptic material 21. However, when the non-contact type probe 20C as shown in FIG. 1(C) is used, only the lines of electric force extending through the pinhole h invade into the electrooptic material 21, and there is no affection of cross-talk.

When the side surfaces of the non-contact type probes 20A and 20B as shown in FIG. 1(A) and 1(B) are shielded by a conductive cylindrical body as not shown, the same shielding effect as the non-contact type probe 20C as shown in FIG. 1(C) can be obtained.

In the construction that the conductive film 22 is provided at the front surface of the electrooptic material 21 (that is, the construction of the non-contact type probes as shown in FIGS. 1(A) to 1(C)), attention should be specifically paid to the effect of parasitic capacitance between the conductive film 22 and all the circuit wirings containing the wiring under test 12 on the circuit under test 10. The capacity is varied in accordance with the shape and size of the non-contact type probes 20A to 20C the width of the wirings on the circuit under test 10 and the distance between the non-contact type probes 20A to 20C and the wiring under test 12, however, it is usually negligibly small value.

For example, when the tip size of the non-contact type probes 20A to 20C (that is, the diameter of the conductive film 22) is set to several tens microns, the width of the electrical wirings is set to several microns and the distance between the conductive film 22 and the wiring under test 12 is set to about 1 micron, the capacity between the conductive film 22 and all the circuit wirings on the circuit under test 10 becomes an extremely small value which is several fF.

This value of the parasitic capacitance is the extremely small value in comparison with a parasitic capacitance value of a needle probe of a needle type semiconductor testing apparatus, and from the rough calculation on the basis of the parasitic capacitance, it is apparent that the voltage measurement with little error can be performed even for a signal of several tens GHz.

Figure 4:
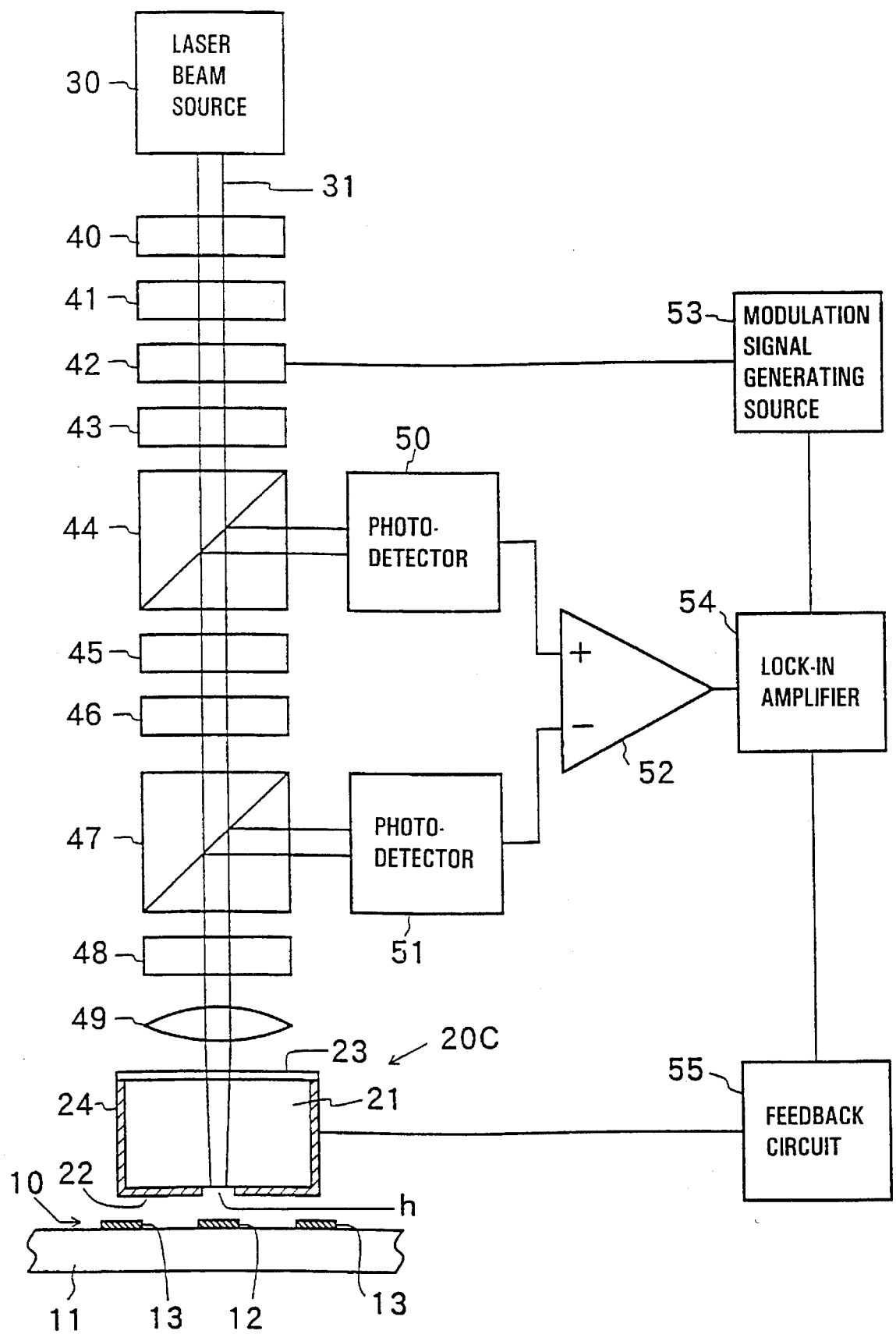
FIG. 4 is a diagram showing an embodiment using a non-contact type probe as shown in FIG. 1C in the second invention apparatus.
Figure 6:
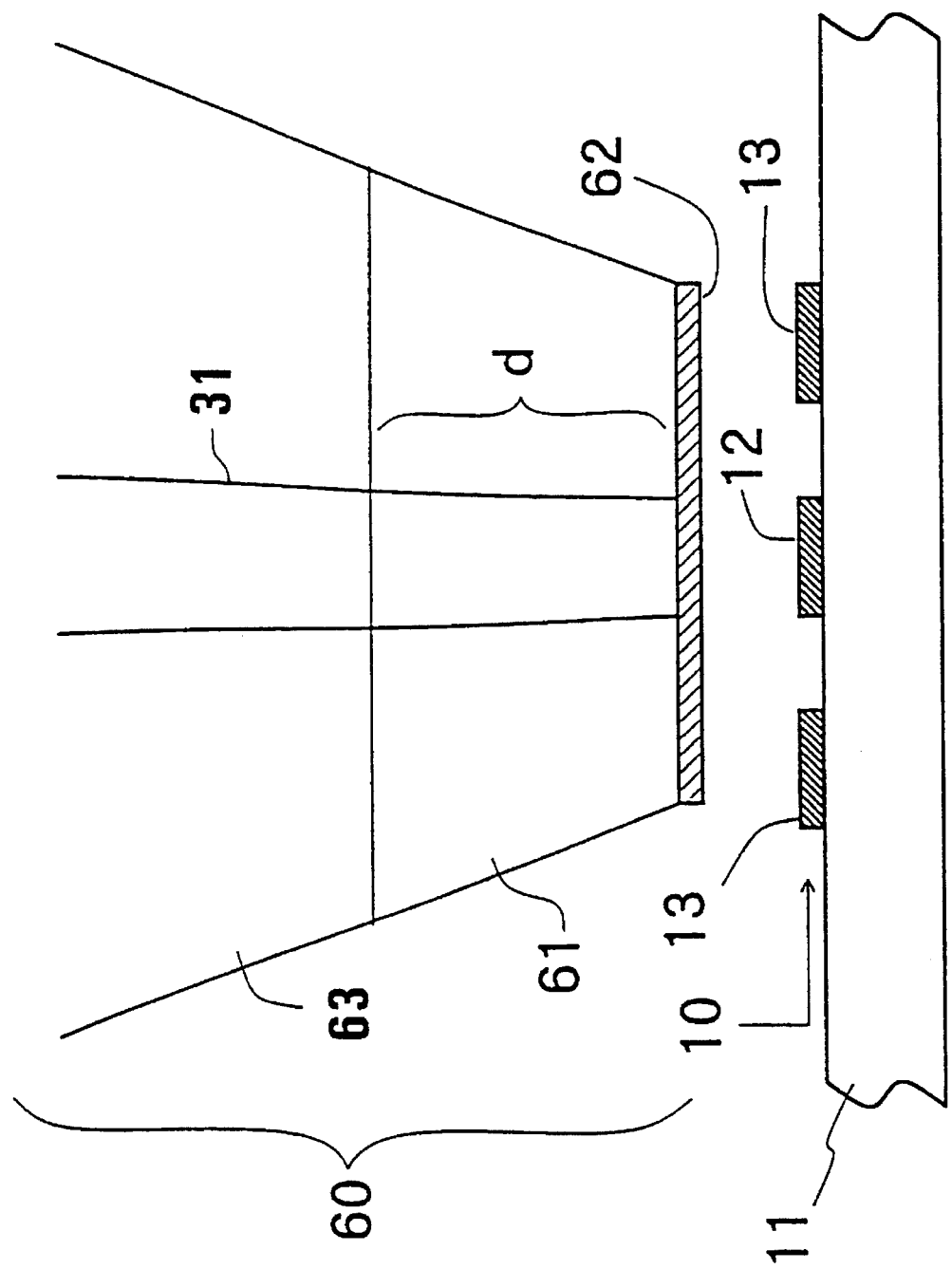
FIG. 6 is a schematic diagram showing the construction Of the probe tip of the conventional non-contact voltage measuring apparatus and the arrangement of the probe and the circuit under test.

Next, an embodiment of the second invention apparatus will be described with reference to the accompanying drawings. FIG. 4 is a diagram showing the whole construction of the non-contact type voltage measuring apparatus using the non-contact type probe 20C as shown in FIG. 1(C). In FIG. 4, the construction of the circuit under test 10 which is formed on the substrate 11 is identical to that of FIG. 2.

In FIG. 4, the detection laser beam 31 irradiated from the laser beam source 30 is incident to the non-contact type probe 20C through an optical system comprising an isolator 40, a polarizer 41, a light modulator 42, a compensator 43, a first polarizing beam splitter 44, a half-wave plate 45, a Faraday rotator 46, a second polarizing beam splitter 47, an one-eight wavelength plate 48, and a focusing lens 49.

In order to detect the polarization state of a reflection signal of the detection laser beam 31, the reflection beams which are split by the polarizing beam splitters 44 and 47 are input to photodetectors 50 and 51, and then the outputs of the photodetectors 50 and 51 are input to a differential amplifier 52 to obtain the difference between both outputs.

A lock-in amplifier 54 serves to remove a noise from the signal output of the differential amplifier 52 using a modulation signal from a modulation signal generating circuit 53 as a reference signal.

A feedback circuit 55 serves to control the voltages of conductive films 22, 23 and 24 which are formed on the irradiation surface of the electrooptic material 21 for the external electric field, the incident and emitting surface of the electrooptic material 21 for the detection light and all the side surfaces of the electrooptic material 21 so that the signal output of the differential amplifier 52 is fixed to a constant value.

In this case, the voltages of the conductive films 22, 23 and 24 are not fixed to a constant value, but controlled to be variable in accordance with the voltage of the wiring under test 12.

In the measuring apparatus as shown in FIG. 4, the irradiation surface for the external electric field is also coated with a conductive film having a pinhole h like the measuring apparatus as shown in FIG. 2. Therefore, the variation in polarization state due to the electrooptic effect which is caused when the detection laser beam 31 propagates in the electrooptic material 21 is determined by only the voltage of the wiring under test 12, and thus no cross-talk is caused by the other wirings on the circuit under test 10.

The operation of the non-contact type voltage measuring apparatus thus constructed will be described in detail.

The signal output from the differential amplifier 52 is controlled to a fixed value at all times. In the following description, in order to facilitate the understanding of this invention, it is assumed that the control is carried out by the feedback circuit 55 so that the signal output of the differential amplifier 52 is equal to zero. The voltage of the wiring under test 12 at a time t is represented by Vt, and assuming that the conductive films 22, 23 and 24 which are formed on the irradiation surface of the electrooptic material 21 for the external electric field, the incident and emitting surfaces of the electrooptic material 21 for the detection laser beam and all the side surfaces of the electrooptic material 21 are controlled to a voltage Vb (hereinafter referred to as "feedback voltage") by the feedback circuit 55, the voltage at one end point of the integration range of the equation (4) is equal to Vb.

Since the feedback control is carried out so that the output is equal to zero at all times, the voltage at the other end point of the integration range of the equation (4), that is, the voltage at the center of the pinhole opening surface on the conductive film 22 provided on the surface of the electrooptic material 21 must be equal to the feedback voltage Vb to equalize the integration value of the equation (4) to zero.

In consideration of the arrangement that the wiring under test 12 is disposed beneath the pinhole h, if the voltage Vt is completely equal to the feedback voltage Vb, the potentials of the inside of the electrooptic material 21 and the gap between the probe 20C and the wiring under test 12 are equal to each other, so that the integration value of the equation (4) is zero.

In other words, if the voltages of the conductive films 22, 23 and 24 are controlled with the feedback circuit 55 so that the signal output of the differential amplifier 52 is equal to zero at all times, the equation $Vb = Vt$ is satisfied at all times, and the feedback voltage Vb is equal to Vt to be measured. Therefore, it is proper that the value of Vb is used as a measurement value.

In the first invention apparatus as described with reference to FIG. 2, there is a case where the gap interval between the non-contact type probe (20A in FIG. 2) and the wiring under test 12 is varied to determine the voltage of the wiring under test 12 by corresponding the intensity of the light signal detected by the photodetector 50 to the voltage of the wiring under test 12. In such a case, the light signals detected by the photodetectors 50 and 51 are varied, and thus the measurement value is also varied because the fringe electric field invading into the electrooptic material 21 through the pinhole h is varied.

On the other hand, in the second invention apparatus as described with reference to FIG. 4, the inside of the electrooptic material 21 and the gap between the non-contact type probe (20C in FIG. 3) and the wiring under test 12 are kept to the same potential at all times, and the feedback control is carried out so that the detected light signal is equal to zero at all times, therefore no affection is imposed on the feedback voltage Vb which is a whole output value of this system even when the gap interval g is varied, and the absolute value of the voltage to be measured can be obtained.

Here, in a case where the feedback circuit 55 can not perform a follow-up operation because the signal frequency of the wiring under test 12 is high, if a pulse light source is used as the laser beam source 30 to perform a sampling operation of the signal of the wiring under test 12, or a sampling operation is carried out when the signal is detected by the photodetectors 50 and 51, the limit of the band of the feedback circuit 55 can be moderated, and no problem occurs in operation.

As described above, according to the second invention apparatus, the voltage of the wiring under test 12 can be directly measured as the absolute voltage value, and in addition the following excellent advantage can be obtained: the measurement is not dependent on the gap interval g between the non-contact type probe (in FIG. 4, the probe as shown in FIG. 1(C) is used, however, the probe used in this embodiment is not limited to the probe as shown in FIG. 1(C)) and the wiring under test 12, and the measurement is carried out with no affection of the cross-talk by all the wirings 13 other than the wiring under test 12 on the circuit under test 10.

In the above embodiment, the two polarizing beam splitters 44 and 47 are used in the optical system for detecting the polarization of the detection laser beam 31. This is one of system architectures in which the in-phase fixed bias and noise components are removed from the signals of opposite phase and in-phase fixed bias and noise components of the two light signals in the difference amplifier 52 and only the signal components based on the polarization are detected with high sensitivity, and thus it is not significantly related to the subject matter of this invention.

However, in order to perform such a feedback control that the difference between the feedback voltage Vb and the voltage Vt of the wiring under test 12 is equal to zero at all times, detection of the phase of the light signal or the like is required to determine a direction to be controlled in any manner (directions " of increase and decrease in feedback voltage) because the value of the light signal detected by the photodetectors 50 and 51 serving as a detector for light energy is positive at all times. In the optical system for detecting the variation in polarization of the detection laser beam 31 as shown in FIG. 4, this is realized by differentiating the two signals having signals of mutually-opposite phase and in-phase fixed bias and noise components.

In the embodiment as described with reference to FIG. 4, the difference between the feedback voltage Vb and the voltage Vt of the wiring under test 12 is set to zero at all times. However, the difference is not necessarily set to zero, and no obstruction occurs in the operation even if the difference may be set to a specific value. In this case, a fixed bias is merely added to a measurement result.

The above description is made for the construction of the non-contact type probe that the conductive films 22, 23 and 24 are formed on the irradiation surface of the electrooptic material 21 for the external electric field, the incident and emitting surfaces of the electrooptic material 21 for the detection laser beam, and all the side surfaces of the electrooptic material 21. However, "conductive film 23 or 24 is not necessarily required to be formed on the incident and emitting surfaces for the detection laser beam or all the side surfaces of the electrooptic material 21 insofar as the conductive film 22 is formed on the irradiation surface for the external electric field.

That is, if the size of the tip of the non-contact type probe (that is, the size of the irradiation surface for the external electric field which is coated with the conductive film 22) is wider than the width of the wirings on the circuit under test 20 and the interval between the wirings, the affection of the cross-talk is practically depressed to a negligible level, so that the conductive films 23 and 24 are not required: Further, if the thickness of the electrooptic material 21 is set to such a value that it is not affected by the fringe electric field from all wirings on the circuit under test, the transparent conductive film 23 to be coated on the incident and emitting surfaces for the detection laser beam may not be provided.

Next, an embodiment of a non-contact type fiber probe (a non-contact type probe having a probe comprising an optical fiber) according to this invention will be described with reference to FIGS. 5(A) and (B).

In FIG. 5(A), a core 25 is formed of electrooptic material, and the core 25 is coated with a cladding 26 having lower refractive index than the core 25 (electrooptic material). The peripheral surface of the cladding 26 and a surface portion at the tip of the optical fiber excluding the end surface of the core 25 are coated with a conductive film 27. In this case, the end surface portion h' of the core 25 corresponds to the pinhole h of the non-contact type probes 20A to 20C as shown in FIGS. 1(A) to (C) respectively. As not shown, only the peripheral surface of the cladding 26 may be coated with the conductive film 27.

FIG. 5(B) shows another construction of the non-contact type fiber probe. In FIG. 5(B), the core 25 formed of electrooptic material is coated with a cladding 28. The cladding 28 is formed of material having lower refractive index than the electrooptic material 25 and also having conductivity. The conductive cladding 28 of this non-contact type fiber probe has both functions as the cladding 26 as shown in FIG. 5(A) and the conductive film 27.

The third and fourth invention apparatuses of this invention are implemented by using the non-contact type fiber probes as shown in FIGS. 5(A) and (B) in place of the non-contact type probes (20A, 20C) which are used in the embodiments of the first and second invention apparatuses as shown in FIG. 2 or FIG. 4.

In the third and fourth invention apparatuses, the affection (cross-talk) of the wirings other than the wiring under test on the circuit under test can be removed by the conductive film 27 or the conductive cladding 28. Further, in the fourth invention apparatus, the voltage of the conductive film 27 or the conductive cladding 28 is subjected to the feedback control so that the photodetection signal is equal to a fixed value, thereby performing a noncontact measurement without being affected by the variation of the gap interval. In a case of using a probe in which only the peripheral surface of the cladding 26 is coated the conductive film 27, the electric fields applied from the wirings other than the wiring under test are also applied to the end surface of the non-contact type fiber probe. However, if the tip of the non-contact type fiber probe is processed in an extremely-fine structure, the affection of cross-talk hardly occurs.

The third and fourth invention apparatuses are different from the first and second invention apparatuses in that the propagating path of the detection laser beam is enclosed in the core due to the difference in refractive index between the cladding 26 or 28 and the core 25, that is, the third and fourth invention apparatuses use the noncontact type fiber probe having the same structure as an optical fiber, and have an advantage that it is unnecessary to positionally adjust the laser beam to the center of the pinhole opening surface, and thus the arrangement of the optical system is facilitated.

The electrooptic material used for the core 25 is not formed of conventional inorganic material such as lithium niobate, lithium tantalate, GaAs or the like, but formed of organic material. As organic material having large electrooptic effect is cited non-linear organic material for a second harmonic generation device, so-called SHG device.

In general, materials having high nonlinear optical coefficient have high electrooptic effect. These organic materials have many excellent properties such as high electrooptic coefficient, high response speed, low dielectric constant and small load effect, etc. When the non-contact type fiber probe of this invention is produced using the above organic material for the core 25, the organic material is formed into a hollow capillary serving as the cladding 26 or 28 by sucking raw material of the melted organic material into the capillary utilizing capillary phenomenon. At this time, the organic material formed into the capillary is in a polycrstalline state, and thus it is remelted and crystallized or is supplied with electric field at a temperature below the melting point to polarize it.

In the non-contact type fiber probe as described above, there can be obtained excellent effects that the pinhole diameter is necessarily determined by the capillary diameter in the fiber-type structure and thus the pinhole formation can be easily performed, and that it is not necessary to align the detection laser beam 31 to the center of the pinhole opening surface.

The following effects can be obtained by the constructions of this invention as described above.

(1) According to the first invention apparatus, the irradiation surface of the electrooptic material for the external electric field is coated with the conductive film having the pinhole, and the incident and emitting surfaces of the electrooptic material for the detection light and the side surfaces of the electrooptic material are coated with the conductive film. Therefore, the excellent effect that the voltage measurement can be performed with no affection of cross-talk by the wirings other than the wiring under test on the circuit under test can be obtained.

(2) According to the second invention apparatus, since the voltage of the conductive film is subjected to the feedback control in the feedback circuit so that the output of the photodetector for photodetecting the emitted light from the electrooptic element is equal to a predetermined constant value, in addition to the effect of the first invention apparatus, the more excellent effect that the absolute measurement of the voltage can be performed without being dependent on the gap interval between the probe and the circuit under test.

(3) According to the third and fourth invention apparatuses, since the probe is constructed by an optical fiber having a core formed of organic material, and a cladding is coated with a conductive film or formed of a conductive material, the absolute voltage measurement can be performed with no cross-talk and without depending on the gap interval between the probe and the circuit under test. In addition, since the probe of these invention apparatuses has the fiber type structure, the production of the probe and the alignment of the optical system can be easily performed.

What is claimed is:

1. A non-contact type probe comprising an electrooptic material having an irradiation surface for an external electric field and incident and emitting surfaces for a detection light, wherein said irradiation surface for the external electric field is coated with a conductive film having a pinhole.

2. The non-contact type probe as claimed in claim 1, wherein said incident and emitting surfaces of said electrooptic material are coated with a transparent conductive film.

3. The non-contact type probe as claimed in claim 2, wherein surfaces of said electrooptic material other than said incident and emitting surfaces are coated with a conductive film.

4. A non-contact type probe as in claim 1 wherein said electrooptic material includes a core of an optical fiber, the core of the fiber having an end wherein said pinhole is proximately disposed.

5. A non-contact type probe as in claim 1 wherein:
    said electrooptic material includes a core of an optical fiber; and
    said conductive film includes a cladding coupled to the core of the optical fiber.

6. A non-contact type voltage measuring apparatus, comprising:
    a light source for generating a detection light;
    a non-contact type probe comprising an electrooptic material having an irradiation surface for an external electric field and incident and emitting surfaces for said detection light, wherein said irradiation surface for the external electric field is coated with a conductive film having a pinhole, wherein the conductive film coated on the electrooptic material is kept at a fixed potential, said non-contact type probe being disposed in such a manner that the detection light incident into said electrooptic material is reflected from a pinhole opening surface or passed in parallel to a surface having a pinhole and adjacently to said pinhole;
    a photodetector for photodetecting a light emitted from said electrooptic material; and
    means for detecting a polarization state of said detection light in said electrooptic material on the basis of the output of said photodetector.

7. The apparatus as claimed in claim 6, wherein said incident and emitting surfaces of said electrooptic material are coated with a transparent conductive film.

8. The apparatus as claimed in claim 7, wherein surfaces of said electrooptic material other than said incident and emitting surfaces are coated with a conductive film.

9. A non-contact type voltage measuring apparatus as in claim 6 further including:
    a feedback circuit for controlling a voltage of said conductive film coated on said electrooptic material so that the output of said photodetector is constant.

10. The apparatus as claimed in claim 9, wherein said incident and emitting surfaces of said electrooptic material are coated with a transparent conductive film.

11. The apparatus as claimed in claim 10, wherein surfaces of said electrooptic material other than said incident and emitting surfaces are coated with a conductive film.

12. A non-contact type voltage measuring apparatus, including:
    a light source for generating a detection light;
    a non-linear probe optically connected to said light source, said non-linear probe comprising one of the following group: (1) an optical fiber comprising a core formed of material having a refractive index and a cladding formed of material having lower refractive index than that of said core, wherein a peripheral surface of said cladding in the neighborhood of at least one end of said fiber is coated with a conductive film, wherein the conductive film is kept at a fixed potential; and (2) a non-contact type probe comprising an optical fiber, said optical fiber comprising a core formed of material having a refractive index and a cladding formed of material having a lower refractive index than that of said core, wherein said cladding is formed of conductive material, wherein the cladding is kept at a fixed potential;
    a photodetector for photodetecting a reflected light of the detection light at the one end surface of said optical fiber, which propagates in said optical fiber; and
    means for detecting a polarization state of the detection light in the core of said optical fiber on the basis of the output of said photodetector.

13. A non-contact type voltage measuring apparatus, including:
    a light source for generating a detection light;
    a non-contact type probe, comprising one of the following group: (1) an optical fiber comprising a core formed of material having a refractive index and a cladding formed of material having lower refractive index than that of said core, wherein a peripheral surface of said cladding in the neighborhood of at least one end of said fiber is coated with a conductive film; and (2) a non-contact type probe comprising an optical fiber, said optical fiber comprising a core formed of material having a refractive index and a cladding formed of material having a lower refractive index than that of said core, wherein said cladding is formed of conductive material; said non-contact type probe being optically connected to said light source;
    a photodetector for detecting a reflected light of the detection light at the one end surface of said optical fiber, which propagates in said optical fiber;
    means for detecting a polarization state of said detecting light in the core of said optical fiber on the basis of the output of said photodetector; and
    a feedback circuit for controlling a voltage of the conductive film of the non-contact type probe so that the output of said photodetector is constant.

* * * * *